(12) United States Patent
Cai et al.

(10) Patent No.: US 8,940,633 B2
(45) Date of Patent: Jan. 27, 2015

(54) METHODS OF FORMING SEMICONDUCTOR DEVICE WITH SELF-ALIGNED CONTACT ELEMENTS AND THE RESULTING DEVICES

(71) Applicant: GLOBALFOUNDARIES Inc., Grand Cayman (KY)

(72) Inventors: Xiuyu Cai, Niskayuna, NY (US); Ruilong Xie, Niskayuna, NY (US); John A. Iacoponi, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 16 days.

(21) Appl. No.: 13/785,403

(22) Filed: Mar. 5, 2013

(65) Prior Publication Data
US 2014/0252424 A1    Sep. 11, 2014

(51) Int. Cl.
*H01L 21/4763* (2006.01)
*H01L 21/768* (2006.01)
*H01L 23/48* (2006.01)
*H01L 29/40* (2006.01)
*H01L 29/78* (2006.01)

(52) U.S. Cl.
CPC ........ *H01L 21/76879* (2013.01); *H01L 23/481* (2013.01); *H01L 29/401* (2013.01); *H01L 29/785* (2013.01)
USPC ............ 438/621; 438/608; 438/635; 438/641

(58) Field of Classification Search
CPC .............. H01L 29/66477; H01L 29/78; H01L 29/66742; H01L 23/48; H01L 27/088; H01L 21/0223; H01L 21/02614; H01L 21/3165; H01L 21/32683; H01L 21/321; H01L 23/481; H01L 29/401; H01L 29/785
USPC ......... 438/151, 197, 199, 201, 275, 279, 585, 438/233, 256, 586, 597, 770, 700, 713, 584, 438/608, 618, 621, 622, 635, 641, 653
See application file for complete search history.

(56) References Cited

U.S. PATENT DOCUMENTS

| | | |
|---|---|---|
| 4,440,804 A | 4/1984 | Milgram |
| 4,466,172 A | 8/1984 | Batra |
| 4,517,729 A | 5/1985 | Batra |
| 5,106,783 A | 4/1992 | Chin et al. |
| 5,266,523 A | 11/1993 | Manning |
| 5,665,623 A | 9/1997 | Liang et al. |
| 6,025,255 A | 2/2000 | Chen et al. |
| 6,096,644 A | 8/2000 | Lukanc |
| 6,165,880 A | 12/2000 | Yaung et al. |
| 6,258,714 B1 | 7/2001 | Shrivastava |
| 6,265,296 B1 | 7/2001 | Yen et al. |

(Continued)

*Primary Examiner* — Colleen A Matthews
*Assistant Examiner* — Quovaunda V Jefferson
(74) *Attorney, Agent, or Firm* — Amerson Law Firm, PLLC

(57) ABSTRACT

One method discloses performing an etching process to form a contact opening in a layer of insulating material above at least a portion of a source/drain, region wherein, after the completion of the etching process, a portion of a gate structure of the transistor is exposed, selectively forming an oxidizable material on the exposed gate structure, converting at least a portion of the oxidizable material to an oxide material, and forming a conductive contact in the contact opening that is conductively coupled to the source/drain region. A novel transistor device disclosed herein includes an oxide material positioned between a conductive contact and a gate structure of the transistor, wherein the oxide material contacts the conductive contact and contacts a portion, but not all, of the exterior surface of the gate structure.

24 Claims, 9 Drawing Sheets

(56) References Cited

U.S. PATENT DOCUMENTS

| | | | |
|---|---|---|---|
| 6,268,281 B1 | 7/2001 | Shih et al. | |
| 6,291,860 B1 | 9/2001 | Lukanc | |
| 6,329,252 B1 | 12/2001 | Lin | |
| 6,348,379 B1 | 2/2002 | Wang et al. | |
| 6,359,307 B1 | 3/2002 | Wang et al. | |
| 6,448,140 B1* | 9/2002 | Liaw | 438/279 |
| 6,509,229 B1 | 1/2003 | Wang et al. | |
| 6,521,540 B1 | 2/2003 | Li | |
| 6,607,955 B2 | 8/2003 | Lee | |
| 6,885,052 B2 | 4/2005 | Ahn et al. | |
| 6,939,768 B2 | 9/2005 | Jeng | |
| 7,098,114 B1 | 8/2006 | Syau et al. | |
| 7,126,198 B2 | 10/2006 | Steiner et al. | |
| 7,132,708 B2 | 11/2006 | Ahn et al. | |
| 7,332,775 B2 | 2/2008 | Steiner et al. | |
| 7,382,054 B2 | 6/2008 | Luoh et al. | |
| 7,563,701 B2 | 7/2009 | Chang et al. | |
| 7,575,990 B2 | 8/2009 | Wei | |
| 7,582,567 B1 | 9/2009 | Syau et al. | |
| 7,888,804 B2 | 2/2011 | Luoh et al. | |
| 2005/0167763 A1* | 8/2005 | Kuan et al. | 257/396 |
| 2007/0241411 A1 | 10/2007 | Yang et al. | |
| 2010/0038715 A1 | 2/2010 | Babich et al. | |
| 2010/0155743 A1 | 6/2010 | Treu et al. | |
| 2011/0156107 A1* | 6/2011 | Bohr et al. | 257/288 |
| 2012/0001146 A1* | 1/2012 | Lu et al. | 257/4 |
| 2012/0218495 A1* | 8/2012 | Oshima | 349/61 |

* cited by examiner

METHODS OF FORMING SEMICONDUCTOR DEVICE WITH SELF-ALIGNED CONTACT ELEMENTS AND THE RESULTING DEVICES

BACKGROUND OF THE INVENTION

1. Field of the Invention

The present disclosure generally relates to the fabrication of integrated circuits, and, more particularly, to various methods of forming self-aligned contacts for a semiconductor device, and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation and the "packing density" in such products has been increased over the recent years. Such improvements in the performance of transistor devices has reached the point where the limiting factor of the finally achieved operating speed of complex integrated circuit products is no longer the individual transistor element but the electrical performance of the complex wiring system that is formed above the device level including the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, e.g., transistors with gate lengths of 50 nm and less, the contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the contact regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

However, the aforementioned process of forming self-aligned contacts results in an undesirable loss of the materials that protect the conductive gate electrode, i.e., the gate cap layer and the sidewall spacers, as will be explained with reference to FIGS. 1A-1B. FIG. 1A schematically illustrates a cross-sectional view of an integrated circuit product 10 at an advanced manufacturing stage. As illustrated, the product 10 comprises a plurality of illustrative gate structures 11 that are formed above a substrate 12, such as a silicon substrate. The gate structures 11 are comprised of an illustrative gate insulation layer 13 and an illustrative gate electrode 14. An illustrative gate cap layer 16 and sidewall spacers 18 encapsulate and protect the gate structures 11. The gate cap layer 16 and sidewall spacers 18 are typically made of silicon nitride. Also depicted in FIG. 1A are a plurality of raised source/drain regions 20 and a layer of insulating material 22, e.g., silicon dioxide. FIG. 1B depicts the product 10 after an opening 24 has been formed in the layer of insulating material 22 for a self-aligned contact. Although the contact etch process performed to form the opening 24 is primarily directed at removing the desired portions of the layer of insulating material 22, portions of the protective gate cap layer 16 and the protective sidewall spacers 18 get consumed during the contact etch process, as simplistically depicted in the dashed regions 26. Given that the cap layer 16 and the spacers 18 are attacked in the contact etch process, the thickness of these protective materials must be sufficient such that, even after the contact etch process is completed, there remains sufficient material to protect the gate structures 11. Accordingly, device manufacturers tend to make the cap layers 16 and spacers 18 having an additional thickness that may otherwise not be required but for the consumption of the cap layers 16 and the spacers 18 during the contact etch process. In turn, increasing the thickness of such structures, i.e., increasing the thickness of the gate cap layers 16, causes other problems, such as increasing the aspect ratio of the contact opening 24 due to the increased height, increasing the initial gate height, which makes the gate etching and spacer etching processes more difficult, etc.

The present disclosure is directed to various methods of forming self-aligned contacts for a semiconductor device, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned contacts for a semiconductor device, and the resulting semiconductor devices. One method disclosed includes forming at least one layer of insulating material above a source/drain region of a transistor, performing at least one etching process to form a contact opening in the layer of insulating material above at least a portion of the source/drain region, wherein, after the completion of the etching process, a portion of a gate structure of the transistor is exposed, selectively forming an oxidizable material on at least a portion of the exposed gate structure, performing an oxidation process to convert at least a portion of the oxidizable material to an oxide material, and forming a conductive contact in the contact opening that is conductively coupled to the source/drain region.

A further illustrative method disclosed herein includes forming a gate structure of a transistor above a substrate, wherein the gate structure has an initial height, performing a first etching process to reduce the initial height of the gate structure and thereby define a reduced height gate structure, forming a gate cap layer above the reduced height gate structure, and forming at least one layer of insulating material above a source/drain region of the transistor. In this example, the method also includes the steps of performing at least one second etching process to form a contact opening in the layer of insulating material above at least a portion of the source/drain region, wherein, after the completion of the second etching process, a portion of the gate cap layer and a portion of an upper surface and a portion of a side surface of the gate structure are exposed, selectively forming an oxidizable material on the exposed upper surface and the exposed side surface of the exposed gate structure, performing an oxidation process to convert at least a portion of the oxidizable material to an oxide material, and forming a conductive contact in the contact opening that is conductively coupled to the source/drain region.

Yet another illustrative method disclosed herein includes forming a gate structure of a transistor above a substrate, wherein the gate structure has an initial height and an upper surface, forming at least one layer of insulating material above the source/drain region and on the upper surface of the gate structure, and performing at least one etching process to form a contact opening in the layer of insulating material above at least a portion of the source/drain region, wherein, after the completion of the etching process, a portion of an upper surface and a portion of a side surface of the gate structure are exposed. In this example, the method further includes selectively forming an oxidizable material on the exposed upper surface and the exposed side surface of the exposed gate structure, performing an oxidation process to convert at least a portion of the oxidizable material to an oxide material, and forming a conductive contact in the contact opening that is conductively coupled to the source/drain region.

One illustrative example of a novel transistor device disclosed herein comprises a gate structure positioned above a semiconductor substrate, wherein the gate structure has an exterior surface, and a layer of insulating material is positioned above the substrate and the gate structure. The device also includes a conductive contact positioned in an opening formed in at least the layer of insulating material, wherein the conductive contact is conductively coupled to a source/drain region of the transistor. In this embodiment, the novel device includes an oxide material positioned between the conductive contact and the gate structure, wherein the oxide material contacts the conductive contact and contacts a portion, but not all, of the exterior surface of the gate structure. In more detailed examples, the oxide material contacts a portion, but not all, of the upper surface of the gate structure and contacts a portion, but not all, of the side surface of the gate structure.

Yet another novel transistor device disclosed herein comprises a gate structure positioned above a semiconductor substrate, wherein the gate structure has a gate recess that extends laterally, in a gate length direction, only partially across the upper surface of the gate structure, and a layer of insulating material that is positioned above the substrate and the gate structure. The device also includes a conductive contact positioned in an opening formed in at least the layer of insulating material, wherein the conductive contact is conductively coupled to a source/drain region of the transistor. Lastly, the novel device includes an oxide material positioned in at least the gate recess and between the conductive contact and the gate structure, wherein the oxide material contacts the conductive contact and contacts a portion, but not all, of the gate structure.

BRIEF DESCRIPTION OF THE DRAWINGS

The disclosure may be understood by reference to the following description taken in conjunction with the accompanying drawings, in which like reference numerals identify like elements, and in which.

Figure 1A:
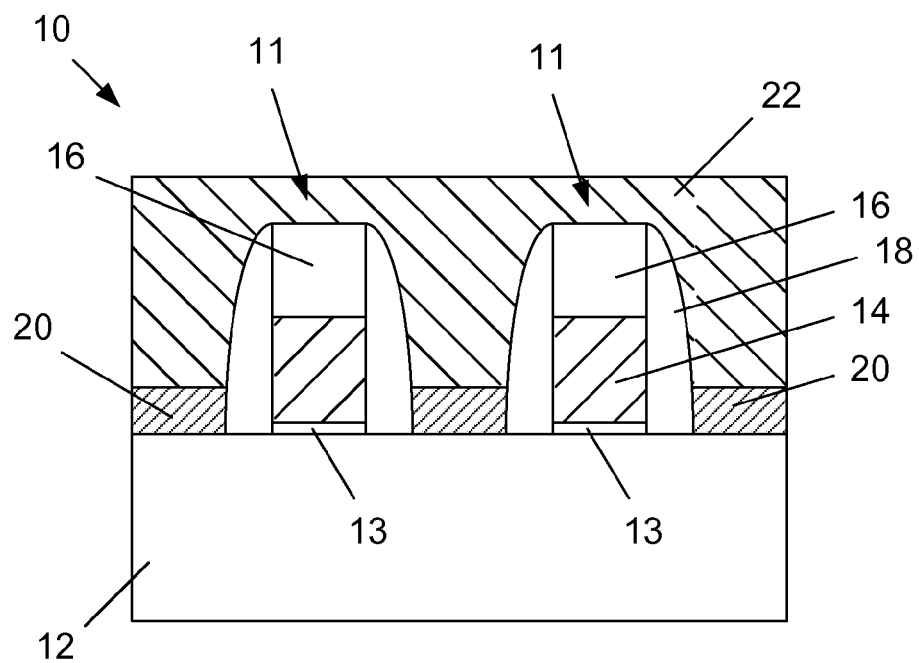
FIGS. 1A-1B schematically illustrate a cross-sectional view of an illustrative prior art integrated circuit product that employs self-aligned contacts.
Figure 1B:
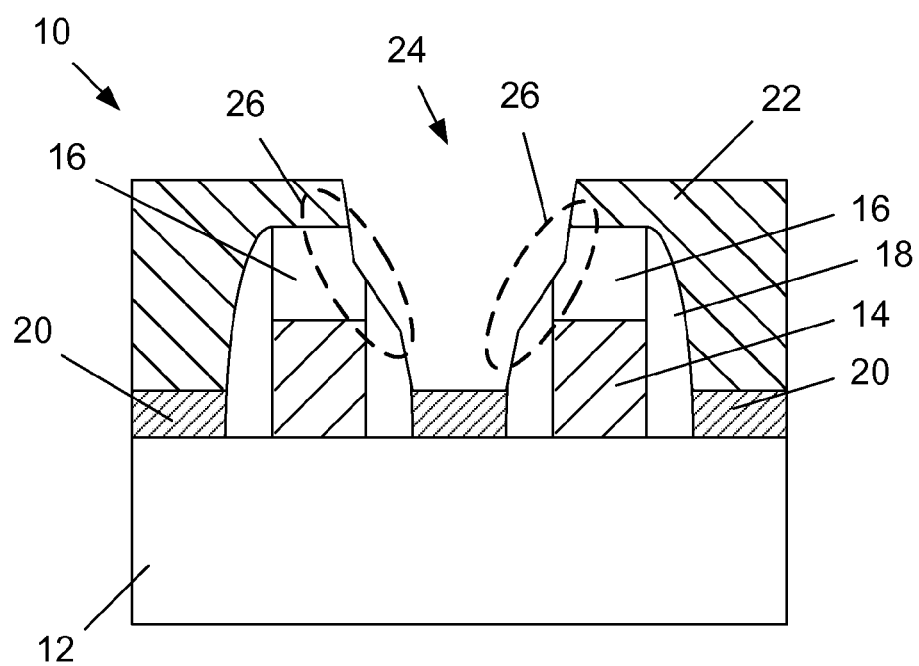

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned contacts for a semiconductor device, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

Figure 2A:
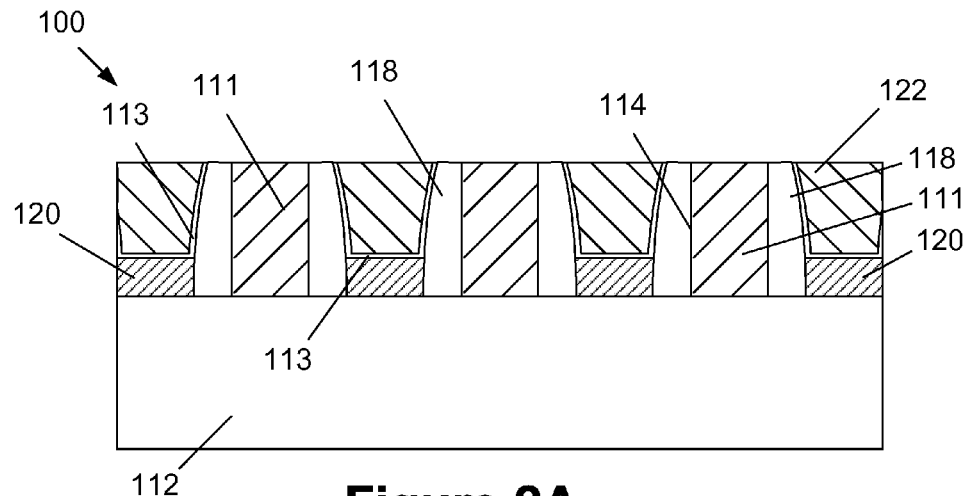
FIGS. 2A-2I depict one illustrative method disclosed herein for forming self-aligned contacts for a semiconductor device, and the resulting semiconductor device.

FIG. 2A schematically illustrates a cross-sectional view of an integrated circuit product 100 at an advanced stage of manufacturing. As illustrated, the product 100 comprises a plurality of illustrative gate structures 111 that are formed above a substrate 112. The substrate 112 may have a variety of configurations, such as the depicted bulk substrate configuration. The substrate 112 may have an SOI (silicon-on-insulator) configuration wherein the semiconductor devices are formed in the active layer of the SOI substrate. The substrate 112 may be made of silicon or it may be made of materials other than silicon. Thus, the terms "substrate," "semiconductor substrate" or "semiconducting substrate" should be understood to cover all semiconducting materials and all forms of such materials. The inventions disclosed herein will be disclosed in the context of forming planar transistor devices. However, as will be recognized by those skilled in the art after a complete reading of the present application, the inventions disclosed herein may be applied to the formation of planar FET devices as well as 3D devices, such as FinFET devices. Moreover, the methods disclosed herein are applicable to forming any type of device, e.g., an NFET device, a PFET device, etc.

With continuing reference to FIG. 2A, the final gate structures 111 are intended to be representative in nature of any type of gate structure that may be employed in manufacturing integrated circuit products using so-called gate-first or gate-last (replacement-gate) manufacturing techniques. In general, the gate structures 111 are comprised of one or more gate insulation layers, such as, for example, silicon dioxide, a so-called high-k (k greater than 10) insulation material (where k is the relative dielectric constant), etc., and one or more conductive material layers that act as the gate electrode, e.g., titanium nitride, tantalum nitride, tungsten, aluminum, polysilicon, etc. In general, in an illustrative replacement-gate manufacturing technique, a so-called "dummy" or sacrificial gate structure (not shown) including a gate cap layer is initially formed above the substrate 112 and patterned. Thereafter, the sidewall spacers 118 (see FIG. 2A) are formed adjacent the patterned dummy gate structure/cap layer. The dummy gate structure remains in place as many process operations are performed to form the device, e.g., the formation of raised, doped source/drain regions, performing an anneal process to repair damage to the substrate caused by the ion implantation processes and to activate the implanted dopant materials. At some point in the process flow, the gate cap layer is removed by performing a chemical mechanical polishing (CMP) process relative to a layer of insulating material so as to expose the dummy gate structure for further processing. Thereafter, one or more etching processes are performed to remove the dummy gate structure which results in the formation of a gate cavity 114 (see FIG. 2A) that is laterally defined by the spacers 118 where the gate structure 111 for the device is formed. For example, after the dummy gate is removed, a conformal chemical vapor deposition (CVD) or atomic layer deposition (ALD) process may be performed to conformably deposit a gate insulation layer comprised of a high-k layer of insulating material, e.g., hafnium oxide, in the gate cavity. Thereafter, one or more metal or metal alloy layers and/or polysilicon layers (that will become the gate electrode) may be deposited in the gate cavity 114 above the gate insulation layer. A CMP process is then performed to remove excess portions of the deposited layers of material positioned outside the gate cavity 114. These operations result in the schematically depicted gate structures 111.

While still referencing FIG. 2A, the illustrative sidewall spacers 118 that were formed adjacent the dummy gate structure (not shown), e.g., silicon nitride spacers, encapsulate and protect portions of the gate structure 111. The spacers 118 were formed by depositing a layer of spacer material adjacent the dummy gate structure and thereafter performing an anisotropic etching process on the layer of spacer material. Also depicted in FIG. 2A are a plurality of raised source/drain regions 120, an etch stop layer 113, e.g., silicon nitride, and a layer of insulating material 122, e.g., silicon dioxide. The raised source/drain regions 120 are provided by way of example, as the inventions disclosed herein may be employed with devices having any type of source/drain regions, e.g., raised or planar. The raised source/drain regions 120 may be formed by performing a variety of known process operations. The etch stop layer 113 may be formed by performing a conformal deposition process, e.g., CVD, ALD, and its thickness may vary depending upon the particular application. FIG. 2A depicts the device 100 after several process operations have been performed, i.e., gate cap removal, dummy gate removal to thereby define the gate cavities 114 (between the spacers 118) where the gate structures 111 will be formed, formation of various layers of material that will make up the gate structure 111 and after a CMP process was performed. Thus, in FIG. 2A, the upper surface of the gate structures 111 is exposed.

Figure 2B:
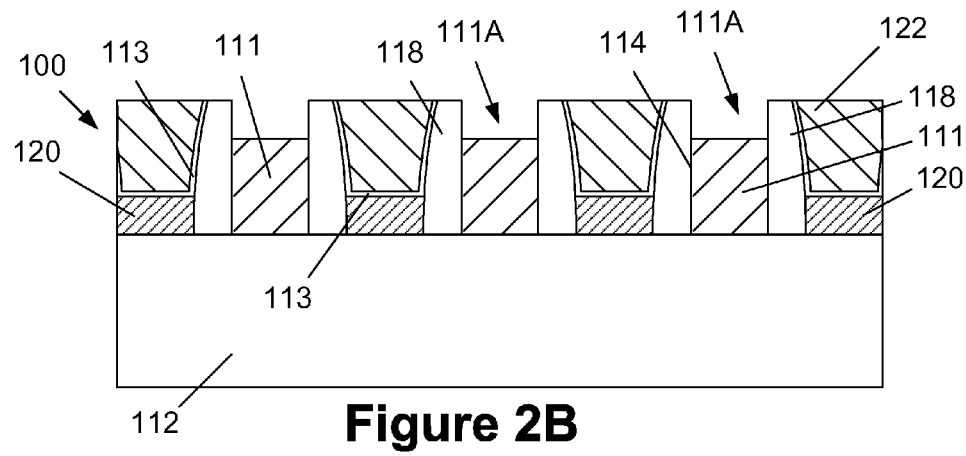

FIG. 2B depicts the product 100 after a timed, recess etching process has been performed to selectively remove portions of the gate structures 111 to thereby define a gate cap recess 111A, the depth of which may vary depending upon the particular application. In one illustrative embodiment, the gate cap recess 111A may have a depth on the order of about 5-20 nm relative to the upper surface of the layer of insulating material 122. In one illustrative embodiment, the etching process performed to form the gate cap recesses 111A may be an anisotropic etching process.

Figure 2C:
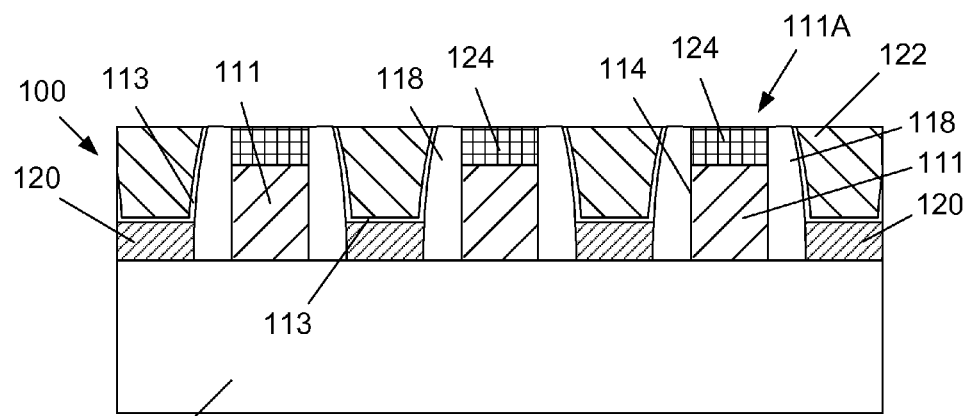

FIG. 2C depicts the product 100 after a gate cap layer 124 has been formed in each gate cap recess 111A. The gate cap layers 124 were formed by depositing a layer of gate cap material, e.g., silicon nitride, so as to overfill the gate cap recesses 111A, and thereafter performing a CMP process to remove the excess gate cap material using the layer of insulating material 122 as a polish-stop layer.

Figure 2D:
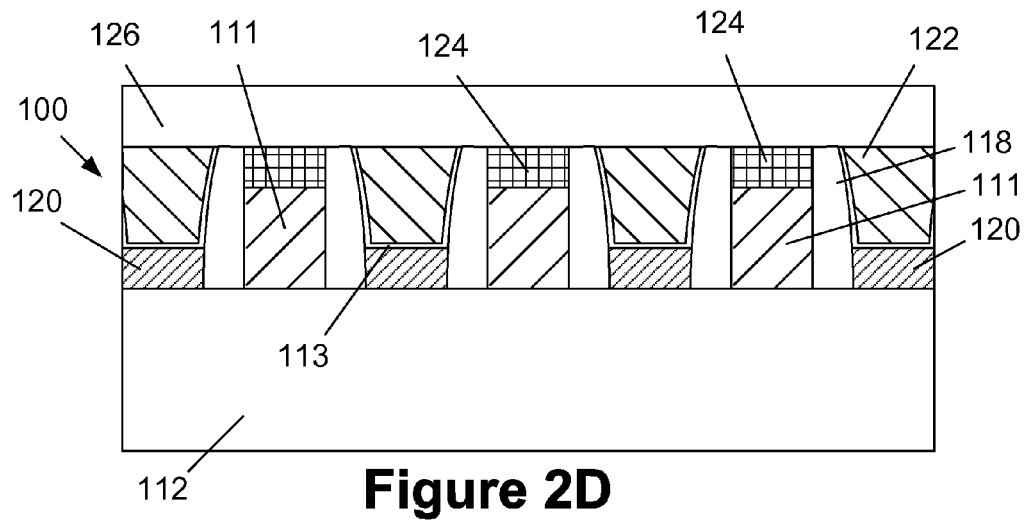

FIG. 2D depicts the product 100 after a layer of insulating material 126 has been deposited across the product 100. The layer of insulating material 126 may be comprised of a variety of different materials, such as silicon dioxide, a low-k (k value less than 3.3) material, etc., and it may be formed by performing a variety of techniques, e.g., CVD, etc. The thickness of the layer of insulating material 126 may vary depending upon the particular application.

Figure 2E:
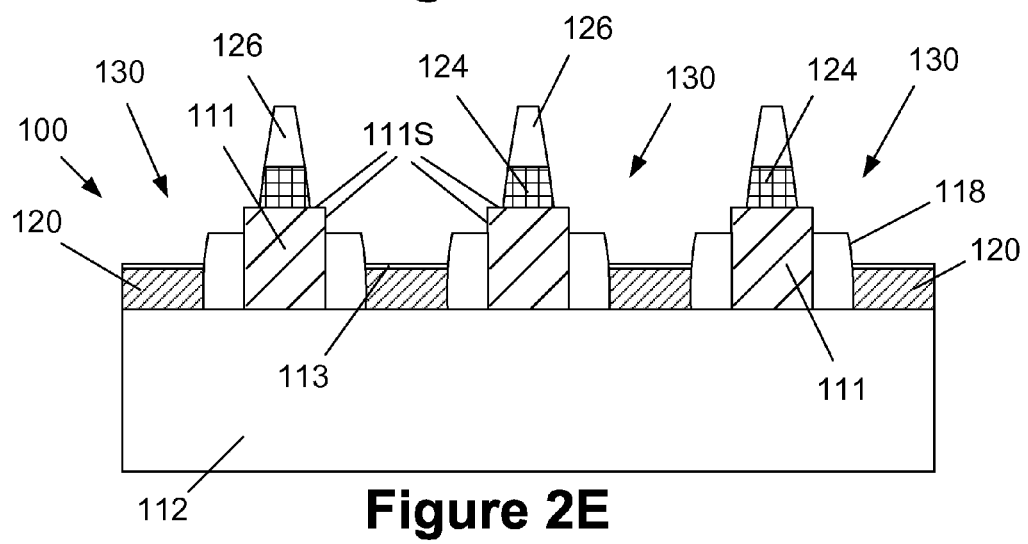

FIG. 2E depicts the product 100 after one or more etching processes were performed on the product 100 through a patterned etch mask (not shown), such as a patterned layer of photoresist material, to remove portions of the layer of insulating material 126 and substantially all of the layer of insulating material 122 to thereby define a plurality of self-aligned contact openings 130. In the depicted example, the self-aligned contact openings 130 are depicted as being precisely aligned relative to the gate structures 111. However, in a real-world device, the self-aligned contact openings 130 may be somewhat misaligned relative to the gate structures 111. During the formation of the self-aligned contact openings 130, portions of the gate cap layer 124 and the sidewall spacers 118 are consumed, thereby exposing some of the surface 111S of the gate structures 111. In the example depicted in FIG. 2E, portions of both the upper surface and the side surfaces of the gate structures 111 are exposed during this etching process. The amount of the side surface exposed depends upon the amount of consumption or "pull-back" of the spacers 118 during the etching process. Note that the etch stop layer 113 remains in place at this point in the process flow to protect the raised source/drain regions 120 during the etching process(es).

Figure 2F:
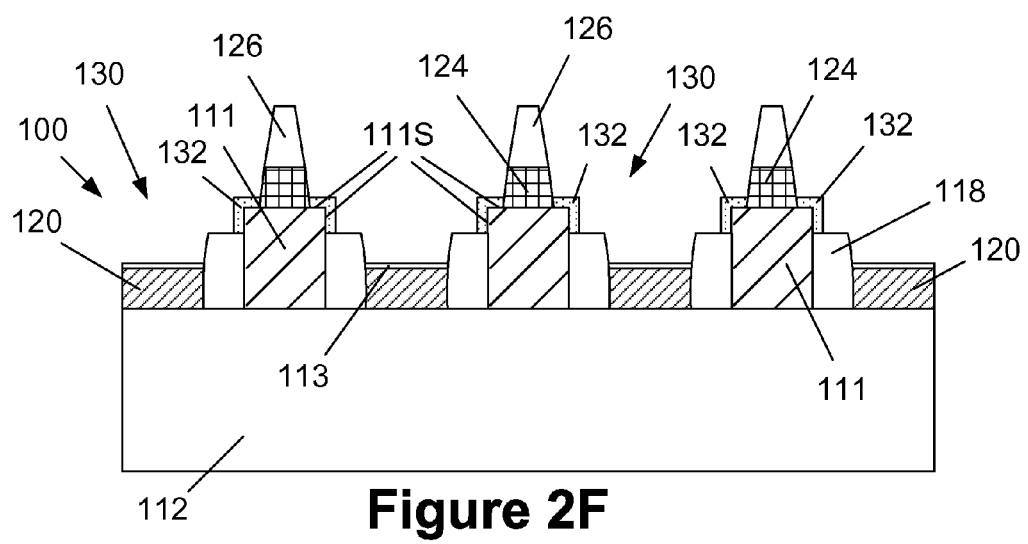

FIG. 2F depicts the product 100 after an oxidizable material 132 is selectively grown on at least portions of the exposed surface or surfaces 111S of the gate structures 111, i.e., the oxidizable material 132 is selectively grown on the exposed metal or conductive materials in the gate structures 111. The oxidizable material 132 may be comprised of a variety of different materials, e.g., a metal, such as aluminum, silicon, etc., and its thickness may vary depending upon the particular application. In one illustrative embodiment, the oxidizable material 132 may have a thickness of about 2-5 nm. The oxidizable material 132 may be formed using a variety of techniques. In one illustrative example, where the oxidizable material 132 is made of aluminum, it may be formed using the techniques generally described in the paper entitled *Selective Growth of Aluminum Using a Novel CVD System*, T. Amazawa, H. Nakamura and Y. Arita (1988), which is hereby incorporated by reference in its entirety.

Figure 2G:
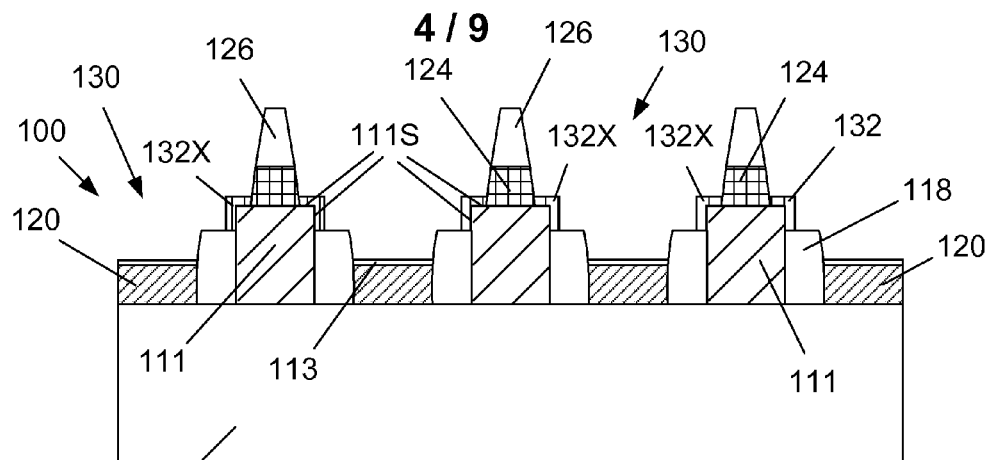

FIG. 2G depicts the product 100 after an oxidation process was performed to convert at least a portion of the oxidizable material 132 into an oxide material 132X, such as a metal oxide, aluminum oxide, silicon dioxide, etc. The oxidation process may be any type of oxidation process, for example, a plasma oxidation process or a GCIB (Gas Cluster Ion Beam) oxidation process, etc. In the depicted example, the oxidation process is performed for a sufficient duration such that substantially the entire thickness of the oxidizable material 132 is converted into oxide material 132X, as reflected by the different reference number and the use of different cross-hatching. However, in other applications, only a surface portion of the thickness of oxidizable material 132 may be converted into oxide material. In one illustrative embodiment, the oxidation process may be performed in a traditional furnace or in an RTA chamber in an oxidizing ambient. The temperature/duration of the oxidation process may vary depending upon the particular application and on how much of the oxidizable material 132 is desired to be converted to an oxide material 132X. In one illustrative embodiment, the oxidation process may be performed at a temperature that falls within the range of about 25-900° C. Note that the etch stop layer 113 remains in place at this point in the process flow to protect the raised source/drain regions 120 during the oxidation process.

Figure 2H:
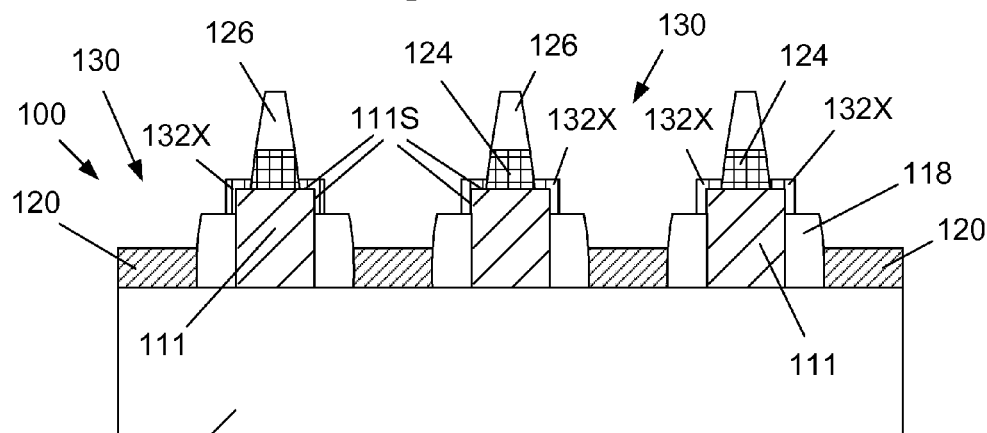

FIG. 2H depicts the device after a very brief "punch through" etching process is performed to remove the remaining portions of the etch stop layer 113 (as well as any other residual materials) so as to thereby expose the source/drain regions 120.

Figure 2I:
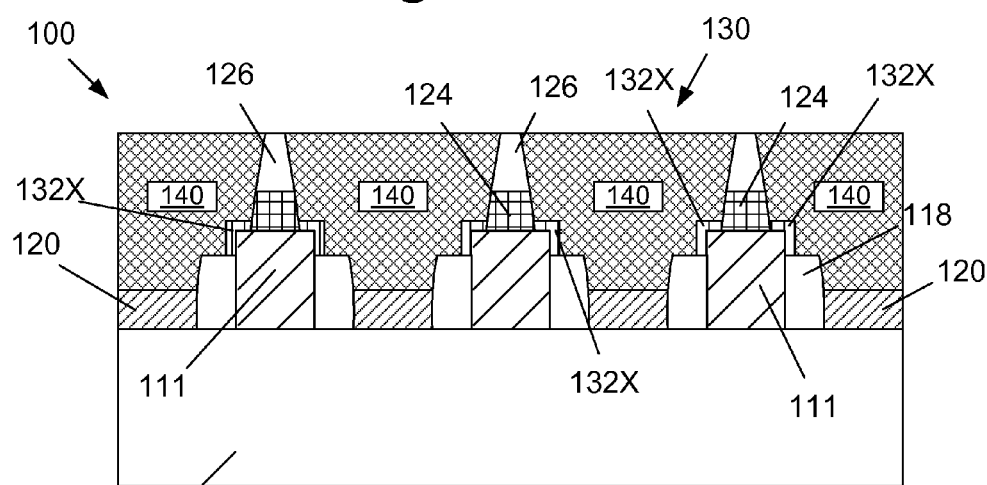

FIG. 2I depicts the product 100 after conductive, self-aligned contact structures 140 have been formed in the self-aligned contact openings 130 such that they are conductively coupled to the source/drain regions 120. The self-aligned contact structures 140 are intended to be schematic and representative in nature, as they may be formed using any of a variety of different conductive materials and by performing traditional manufacturing operations. The self-aligned contact structures 140 may also contain one or more barrier layers (not depicted). In one illustrative example, the self-aligned contact structures 140 may be formed by depositing a liner, e.g., a titanium nitride liner, followed by overfilling the self-aligned contact openings 130 with a conductive material, such as tungsten. Thereafter, a CMP process may be performed to planarize the upper surface of the layer of insulating material 126 which results in the removal of excess portions of the liner and the tungsten positioned above the layer of insulating material 126 outside of the self-aligned contact openings 130 and the formation of the self-aligned contact structures 140. If desired, a metal silicide material (not shown) may be formed on the source/drain regions prior to forming the self-aligned contact structures 140.

Figure 3A:
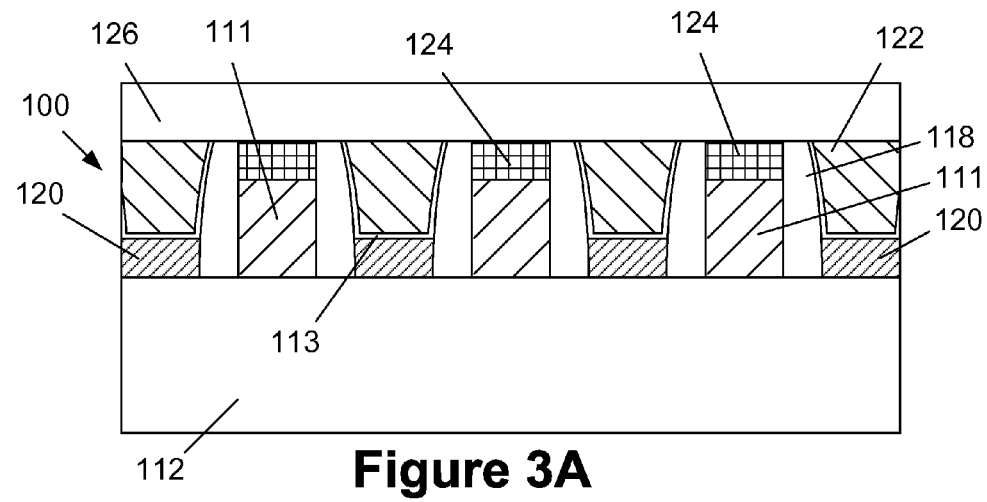
FIGS. 3A-3G depict another illustrative method disclosed herein for forming self-aligned contacts for a semiconductor device, and the resulting semiconductor device.

FIGS. 3A-3G depict another illustrative method disclosed herein for forming self-aligned contacts for a semiconductor device, and the resulting semiconductor device. FIG. 3A depicts the device 100 at a point of fabrication that approximately corresponds to that of the device depicted in FIG. 2D, i.e., after the layer of insulating material 126 has been formed on the device 100.

Figure 3B:
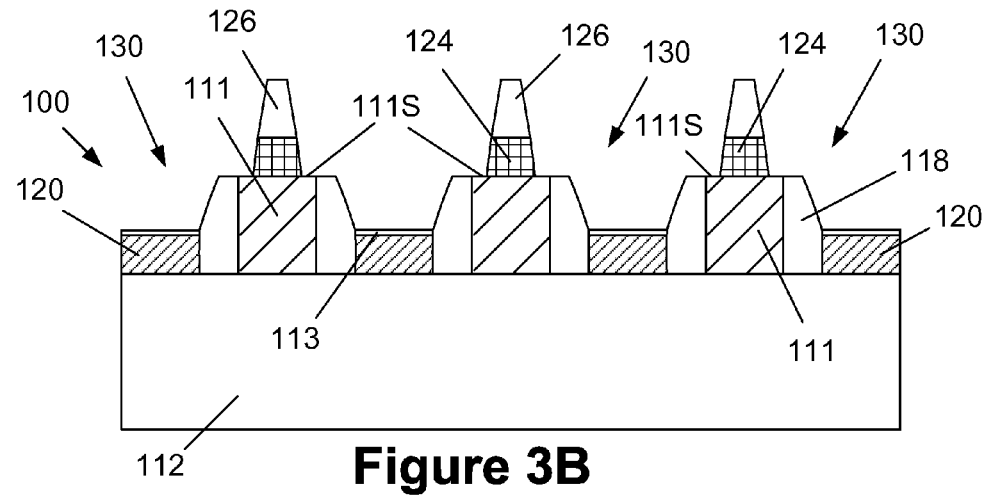

FIG. 3B depicts the product 100 after one or more etching processes were performed on the product 100 through a patterned etch mask (not shown), such as a patterned layer of photoresist material, to remove portions of the layer of insulating material 126 and substantially all of the layer of insulating material 122 to thereby define the self-aligned contact openings 130. Note that the etch stop layer 113 remains in place at this point in the process flow to protect the raised source/drain regions 120 during the etching process(es). During the formation of the self-aligned contact openings 130 in FIG. 3B, portions of the gate cap layer 124 and the sidewall spacers 118 are consumed, thereby exposing some of the surface 111S of the gate structures 111. In the example depicted in FIG. 3B, only portions of the upper surface of the gate structures 111 are exposed during this etching process.

Figure 3C:
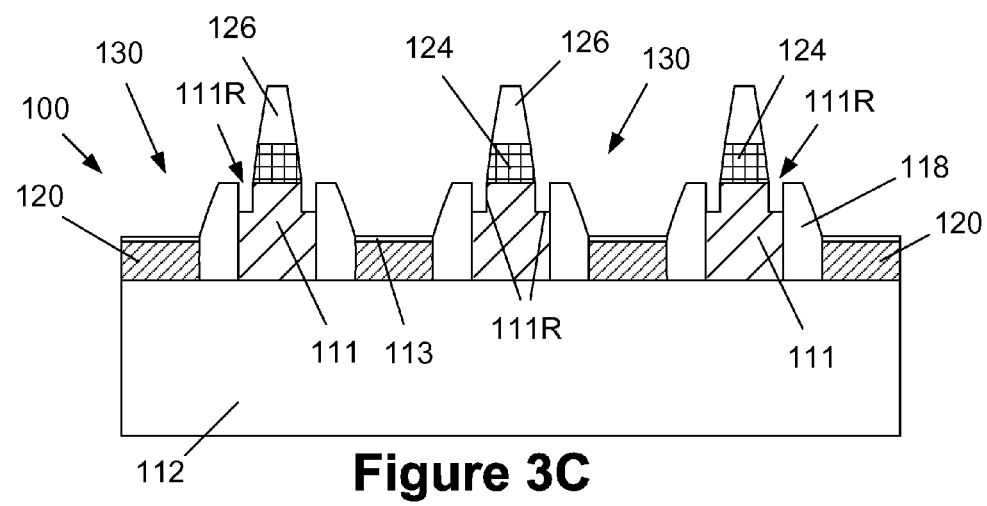

FIG. 3C depicts the product 100 after a timed, recess etching process has been performed to selectively remove the conductive portions of the gate structures 111 to thereby define a gate recess 111R, the depth of which may vary depending upon the particular application. In one illustrative embodiment, the gate recess 111R may have a depth on the order of about 3-10 nm relative to the upper surface of the gate structures 111. The width of the gate recesses 111R may vary depending upon the lateral width of the upper surface of the gate structure 111 that is exposed in forming the self-aligned contact openings 130. In one illustrative embodiment, the etching process performed to form the gate recesses 111R may be an anisotropic etching process.

Figure 3D:
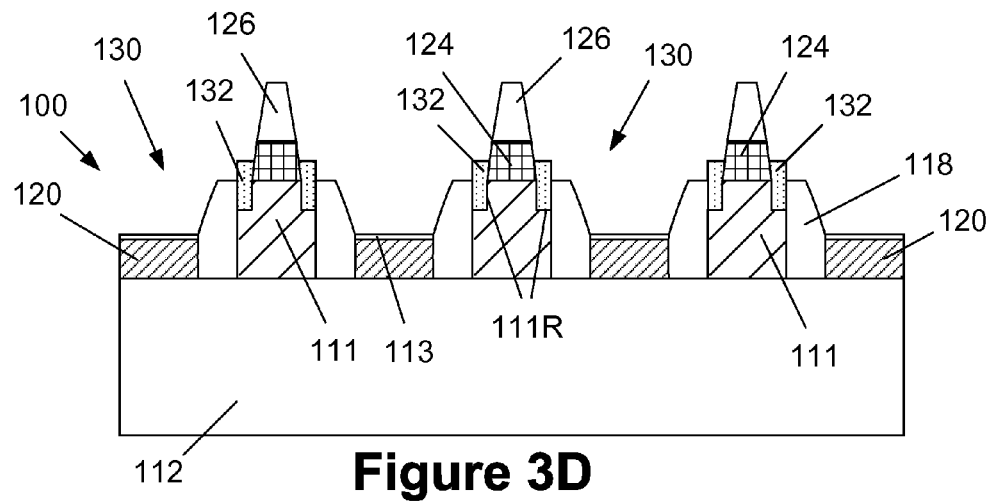

FIG. 3D depicts the product 100 after the previously described oxidizable material 132 has been selectively grown in the gate recesses 111R, i.e., the oxidizable material 132 is selectively grown on the exposed metal or conductive materials in the gate recesses 111R.

Figure 3E:
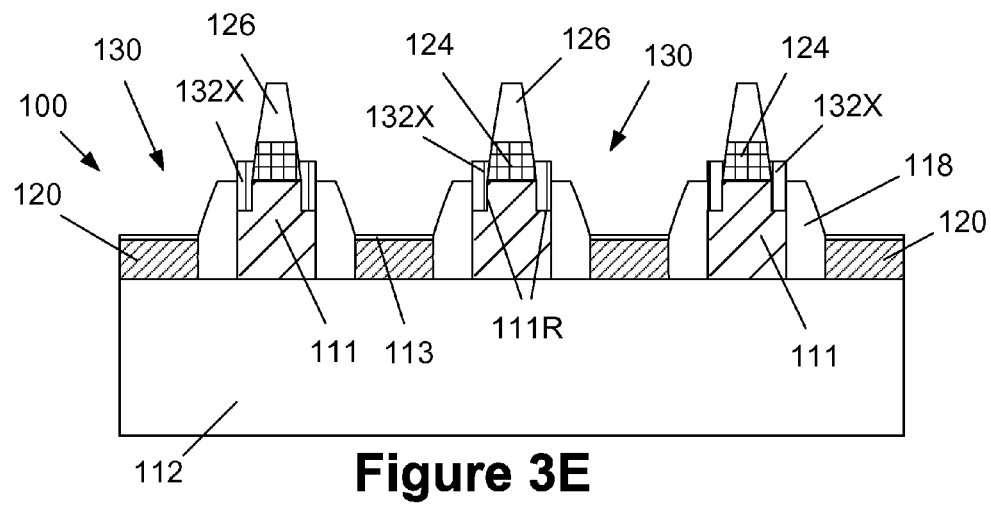

FIG. 3E depicts the product 100 after the above-described oxidation process was performed to convert at least a portion of the oxidizable material 132 into an oxide material 132X.

Figure 3F:
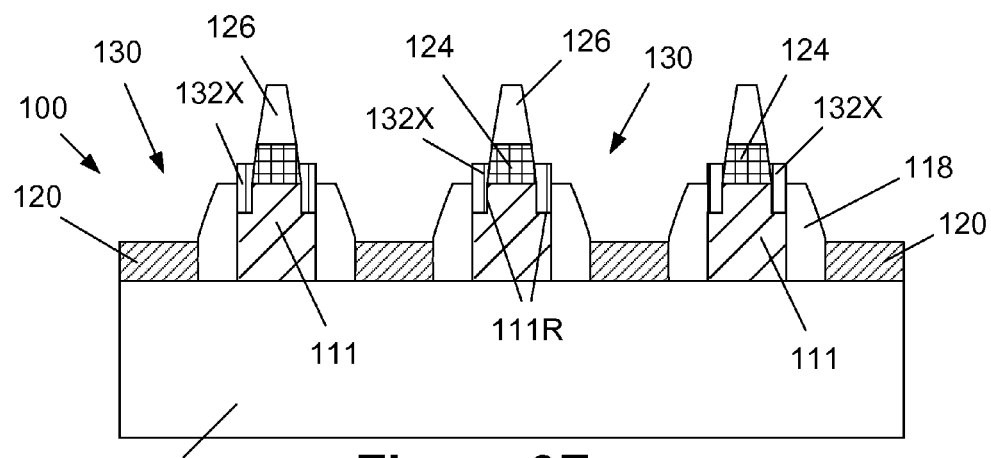

FIG. 3F depicts the device after a very brief "punch through" etching process is performed to remove the remaining portions of the etch stop layer 113 (as well as any other residual materials) so as to thereby expose the source/drain regions 120.

Figure 3G:
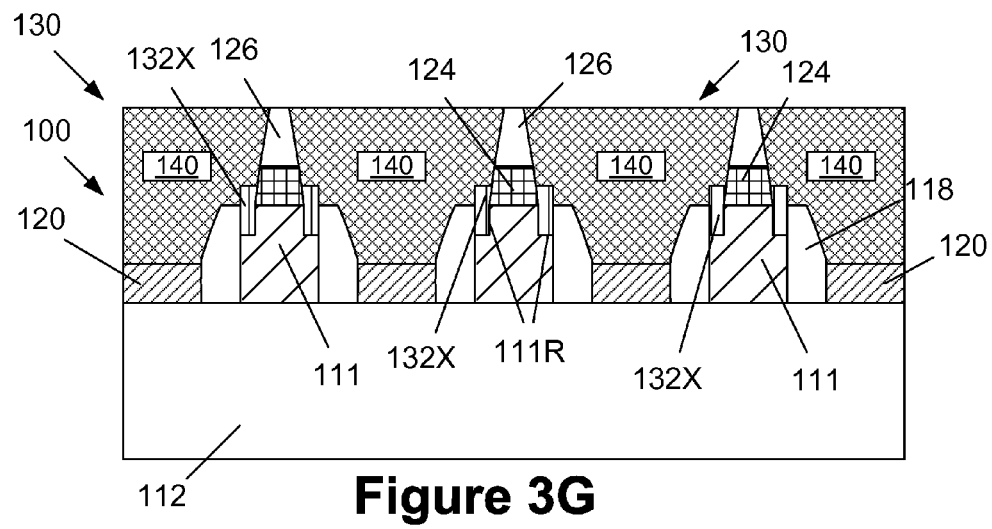

FIG. 3G depicts the product 100 after the above-described conductive, self-aligned contact structures 140 have been formed in the self-aligned contact openings 130 such that they are conductively coupled to the source/drain regions 120.

Figure 4A:
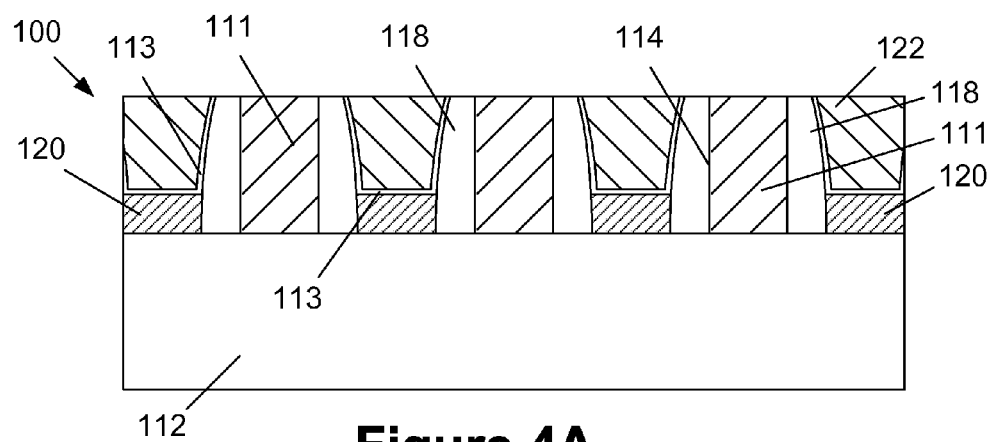
FIGS. 4A-4G depict yet another illustrative method disclosed herein for forming self-aligned contacts for a semiconductor device, and the resulting semiconductor device.
Figure 4B:
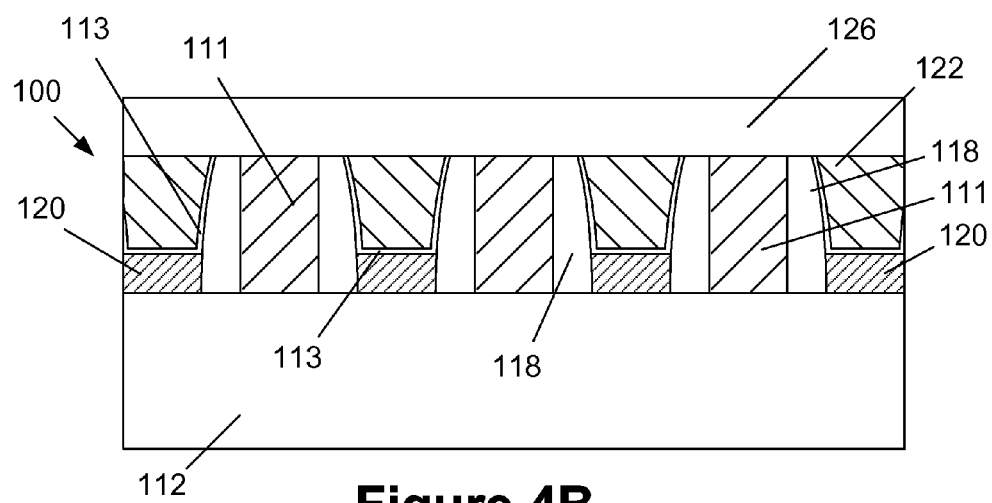

FIGS. 4A-4G depict yet another illustrative method disclosed herein for forming self-aligned contacts for a semiconductor device, and the resulting semiconductor device. FIG. 4A depicts the device 100 at a point of fabrication that approximately corresponds to that of the device depicted in FIG. 2A, i.e., after the gate structures 111 have been exposed. In the embodiment shown in FIGS. 4A-4G, the gate structure 111 is not recessed, nor is a gate cap layer 124 included, as was the case in the previous embodiments FIG. 4B depicts the device 100 after the layer of insulating material 126 has been formed on the device 100.

Figure 4C:
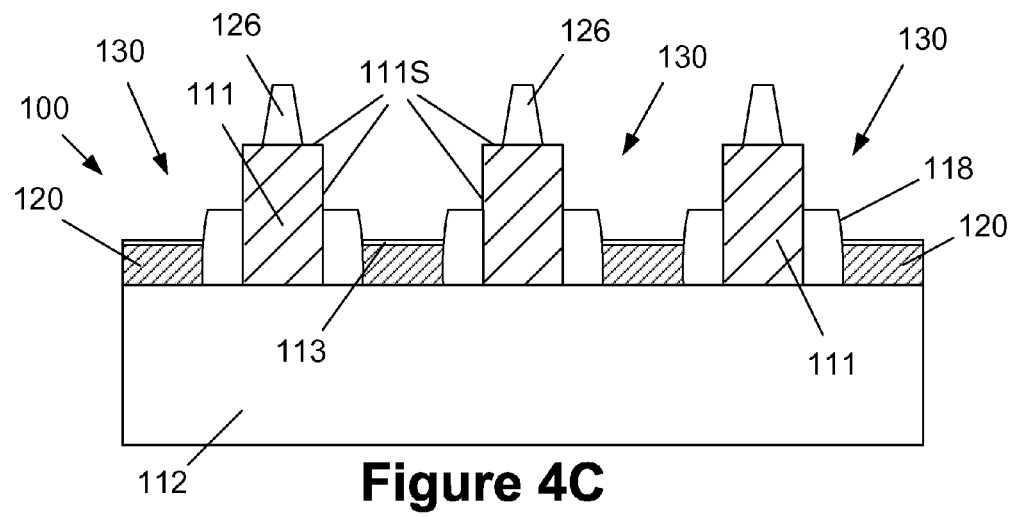

FIG. 4C depicts the product 100 after one or more etching processes were performed on the product 100 through a patterned etch mask (not shown), such as a patterned layer of photoresist material, to remove portions of the layer of insulating material 126 and substantially all of the layer of insulating material 122 to thereby define the self-aligned contact openings 130. In the example depicted in FIG. 4C, portions of both the upper surface and the side surfaces 111S of the gate structures 111 are exposed during this etching process. Note that the etch stop layer 113 remains in place at this point in the process flow to protect the raised source/drain regions 120 during the etching process(es)

Figure 4D:
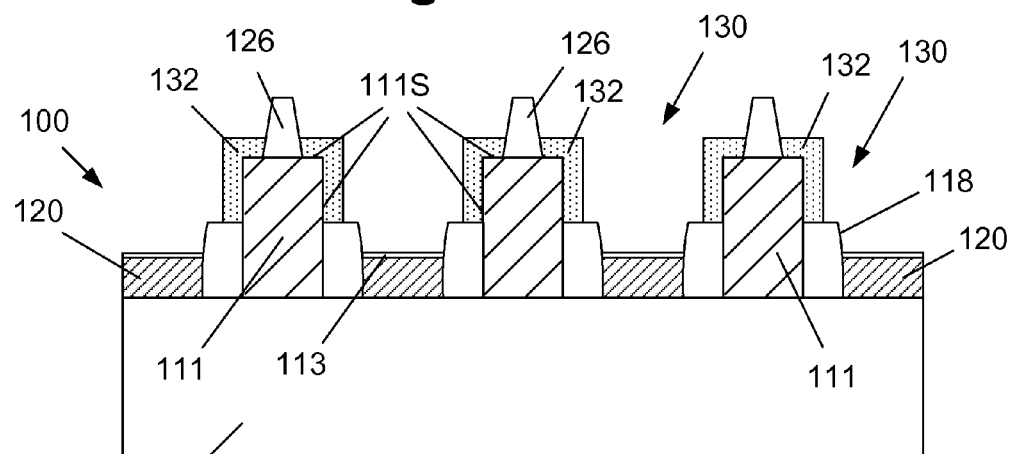

FIG. 4D depicts the product 100 after the previously described oxidizable material 132 has been selectively grown on at least portions of the exposed surface or surfaces 111S of the gate structures 111, i.e., the oxidizable material 132 is selectively grown on the exposed metal or conductive materials in the gate structures 111.

Figure 4E:
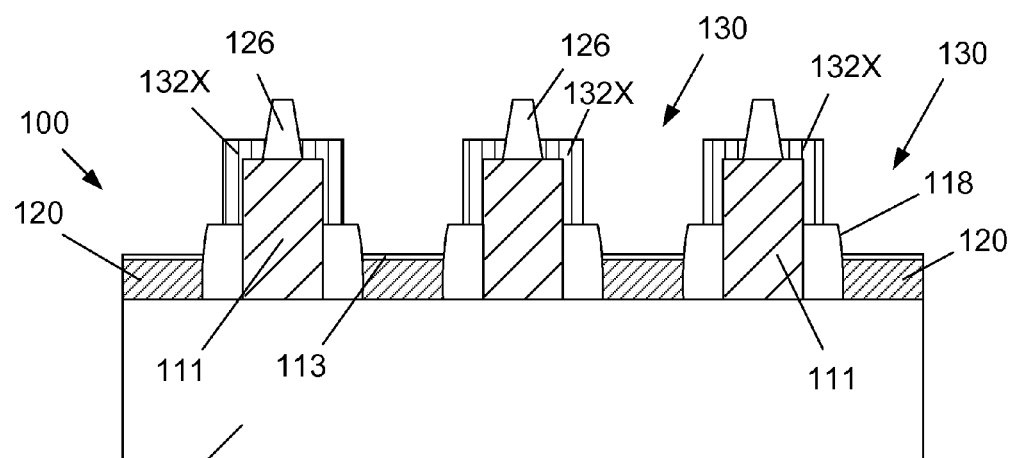

FIG. 4E depicts the product 100 after the above-described oxidation process was performed to convert at least a portion of the oxidizable material 132 into an oxide material 132X. Note that the etch stop layer 113 remains in place at this point in the process flow to protect the raised source/drain regions 120 during the oxidation process.

Figure 4F:
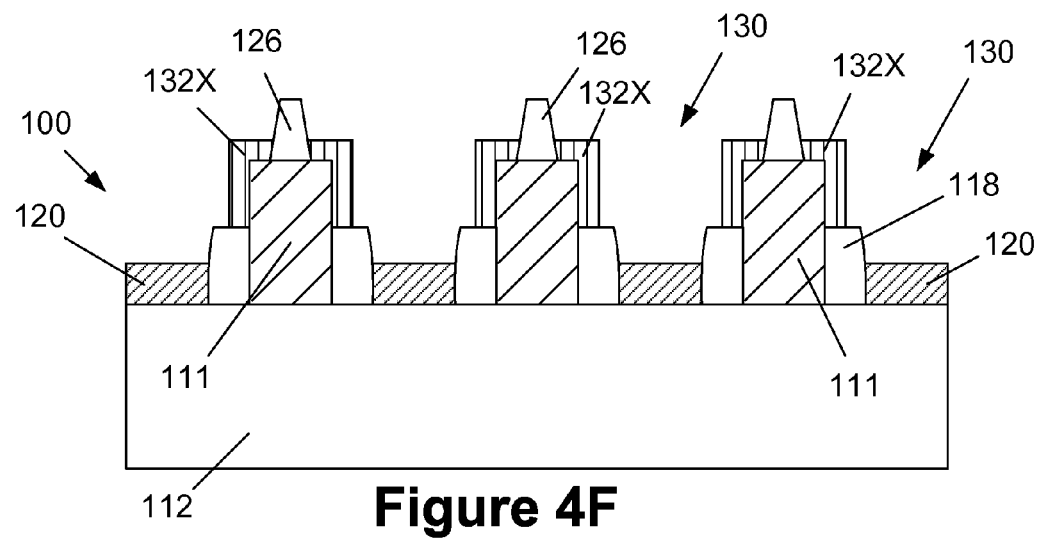

FIG. 4F depicts the device 100 after a very brief "punch through" etching process is performed to remove the remaining portions of the etch stop layer 113 (as well as any other residual materials) so as to thereby expose the source/drain regions 120.

Figure 4G:
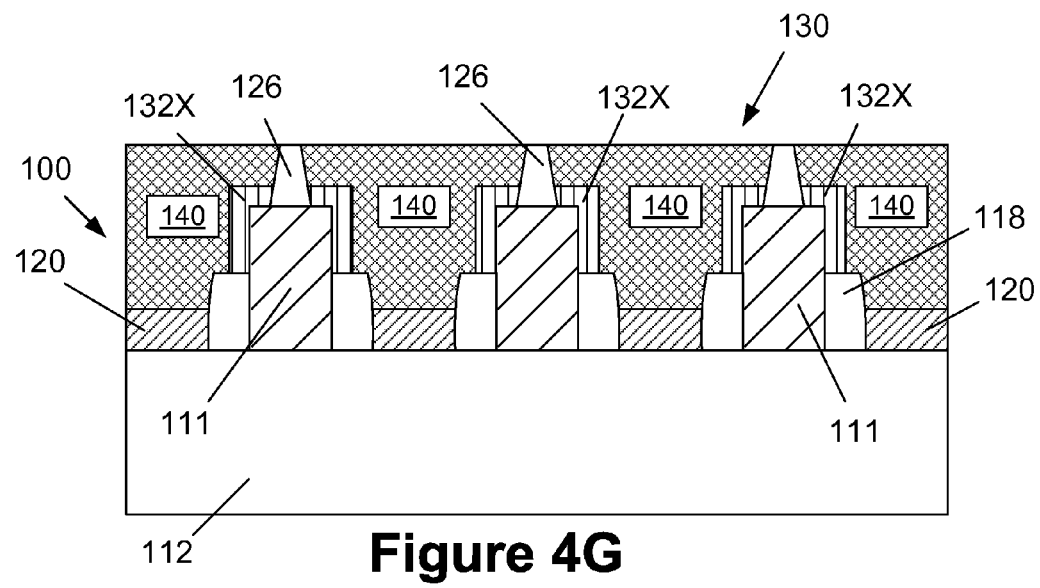

FIG. 4G depicts the product 100 after the above-described conductive, self-aligned contact structures 140 have been formed in the self-aligned contact openings 130 such that they are conductively coupled to the source/drain regions 120.

In one illustrative example disclosed herein, a novel transistor device disclosed in FIGS. 2A-2I and 4A-4G comprises a gate structure 111 positioned above a semiconductor substrate 112, wherein the gate structure 111 has an exterior surface, and a layer of insulating material 126 is positioned above the substrate 112 and the gate structure 111. The device also includes a conductive contact 140 positioned in an opening 130 formed in at least the layer of insulating material 126, wherein the conductive contact 140 is conductively coupled to the source/drain region 120 of the transistor. Lastly, the novel device includes an oxide material 132X positioned between the conductive contact 140 and the gate structure 111, wherein the oxide material 132X contacts the conductive contact 140 and contacts a portion, but not all, of the exterior surface of the gate structure 111. In more detailed examples, the oxide material 132X contacts a portion, but not all, of the upper surface of the gate structure 111 and contacts a portion, but not all, of the side surface of the gate structure 111. In the depicted example, the oxide material 132X has a first portion that is positioned above a portion, but not all, of the upper surface of the gate structure 111 and a second portion that is positioned adjacent a portion, but not all, of the side surface of the gate structure 111. Additionally, in some cases, the first portion and the second portion of the oxide material 132X may be oriented at approximately ninety degrees relative to one another.

In another illustrative example disclosed herein, a novel transistor device disclosed in FIGS. 3A-3G comprises a gate structure 111 positioned above a semiconductor substrate 112, wherein the gate structure 111 has a gate recess 111R that extends laterally, in a gate length direction, only partially across the upper surface of the gate structure 111, and a layer of insulating material 126 that is positioned above the substrate 112 and the gate structure 111. The device also includes a conductive contact 140 positioned in an opening 130 formed in at least the layer of insulating material 126, wherein the conductive contact 140 is conductively coupled to the source/drain region 120 of the transistor. Lastly, the novel device includes an oxide material 132X positioned in at least the gate recess 111R and between the conductive contact 140 and the gate structure 111, wherein the oxide material 132X contacts the conductive contact 140 and contacts a portion, but not all, of the gate structure 111.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, said transistor having a gate structure comprised of a conductive material and a source/drain region, comprising:
    forming at least one layer of insulating material above said source/drain region;
    performing at least one etching process to form a contact opening in said at least one layer of insulating material above at least a portion of said source/drain region; wherein, after the completion of said etching process, a portion of said gate structure is exposed;
    selectively forming an oxidizable material on at least a portion of said exposed gate structure;
    after selectively forming the oxidizable material, performing an oxidation process to convert at least a portion of said oxidizable material to an oxide material; and
    forming a conductive contact in at least said contact opening that is conductively coupled to said source/drain region.

2. The method of claim 1, wherein selectively forming said oxidizable material comprises selectively forming one of a metal, aluminum or silicon.

3. The method of claim 1, wherein performing said oxidation process comprises performing said oxidation process at a temperature that falls within the range of about 25-900° C.

4. The method of claim 1, wherein said etching process exposes both an upper surface and a side surface of said gate structure.

5. The method of claim 4, wherein said oxide material is positioned on said upper surface and said side surface of said gate structure.

6. The method of claim 1, wherein said etching process exposes only an upper surface of said gate structure.

7. The method of claim 6, wherein said oxide material is positioned only on said upper surface of said gate structure.

8. The method of claim 1, wherein selectively forming said oxidizable material on at least a portion of said exposed gate structure comprises selectively forming said oxidizable material on at least any conductive materials in said exposed gate structure.

9. The method of claim 1, wherein said conductive contact is in contact with said oxide material.

10. The method of claim 1, wherein performing said oxidation process converts substantially all of said oxidizable material to said oxide material.

11. A method of forming a transistor, said transistor having a gate structure comprised of a conductive material and a source/drain region, comprising:
- forming said gate structure above said substrate, said gate structure having an initial height;
- performing a first etching process to reduce said initial height of said gate structure and thereby define a reduced height gate structure;
- forming a gate cap layer above said reduced height gate structure;
- forming at least one layer of insulating material above said source/drain region;
- performing at least one second etching process to form a contact opening in said at least one layer of insulating material above at least a portion of said source/drain region, wherein, after the completion of said at least one second etching process, a portion of said gate cap layer and a portion of an upper surface and a portion of a side surface of said gate structure are exposed;
- selectively forming an oxidizable material on said exposed upper surface and said exposed side surface of said exposed gate structure;
- after selectively forming the oxidizable material, performing an oxidation process to convert at least a portion of said oxidizable material to an oxide material; and
- forming a conductive contact in at least said contact opening that is conductively coupled to said source/drain region.

12. The method of claim 11, wherein selectively forming said oxidizable material comprises selectively forming one of a metal, aluminum or silicon.

13. The method of claim 11, wherein performing said oxidation process comprises performing said oxidation process at a temperature that falls within the range of about 25-900° C.

14. The method of claim 11, wherein said oxide material is positioned on said exposed upper surface and said exposed side surface of said exposed gate structure.

15. The method of claim 11, wherein selectively forming said oxidizable material on at least a portion of said exposed gate structure comprises selectively forming said oxidizable material on at least any conductive materials in said exposed gate structure.

16. The method of claim 11, wherein said conductive contact is in contact with said oxide material.

17. The method of claim 11, wherein performing said oxidation process converts substantially all of said oxidizable material to said oxide material.

18. A method of forming a transistor, said transistor having a gate structure comprised of a conductive material and a source/drain region, comprising:
- forming said gate structure above said substrate, said gate structure having an initial height and an upper surface;
- forming at least one layer of insulating material above said source/drain region and on said upper surface of said gate structure;
- performing at least one etching process to form a contact opening in said at least one layer of insulating material above at least a portion of said source/drain region, wherein, after the completion of said at least one etching process, a portion of an upper surface and a portion of a side surface of said gate structure are exposed;
- selectively forming an oxidizable material on said exposed upper surface and said exposed side surface of said exposed gate structure;
- after selectively forming the oxidizable material, performing an oxidation process to convert at least a portion of said oxidizable material to an oxide material; and
- forming a conductive contact in at least said contact opening that is conductively coupled to said source/drain region.

19. The method of claim 18, wherein selectively forming said oxidizable material comprises selectively forming one of a metal, aluminum or silicon.

20. The method of claim 18, wherein performing said oxidation process comprises performing said oxidation process at a temperature that falls within the range of about 25-900° C.

21. The method of claim 18, wherein said oxide material is positioned on said exposed upper surface and said exposed side surface of said exposed gate structure.

22. The method of claim 18, wherein selectively forming said oxidizable material on at least a portion of said exposed gate structure comprises selectively forming said oxidizable material on at least any conductive materials in said exposed gate structure.

23. The method of claim 18, wherein said conductive contact is in contact with said oxide material.

24. The method of claim 18, wherein performing said oxidation process converts substantially all of said oxidizable material to said oxide material.

* * * * *